United States Patent
Korneisel et al.

(10) Patent No.: US 11,326,246 B2
(45) Date of Patent: May 10, 2022

(54) CONTROLLED WARPING OF SHADOW MASK TOOLING FOR IMPROVED RELIABILITY AND MINITURIZATION VIA THIN FILM DEPOSITION

(71) Applicant: Rockwell Collins, Inc., Cedar Rapids, IA (US)

(72) Inventors: Richard Korneisel, Cedar Rapids, IA (US); Nathaniel P. Wyckoff, Marion, IA (US); Jacob R. Mauermann, Marion, IA (US); Bret W. Simon, West Liberty, IA (US); Carlen R. Welty, Solon, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 0 days.

(21) Appl. No.: 16/939,468

(22) Filed: Jul. 27, 2020

(65) Prior Publication Data
US 2022/0025506 A1    Jan. 27, 2022

(51) Int. Cl.
 *C23C 14/04* (2006.01)
 *B05C 21/00* (2006.01)
(52) U.S. Cl.
 CPC .......... *C23C 14/042* (2013.01); *B05C 21/005* (2013.01)
(58) Field of Classification Search
 None
 See application file for complete search history.

(56) References Cited

U.S. PATENT DOCUMENTS

| | | | | |
|---|---|---|---|---|
| 2003/0224109 A1* | 12/2003 | Kang | ............ | C23C 14/042 427/282 |
| 2004/0020435 A1* | 2/2004 | Tsuchiya | ............ | C23C 14/042 118/723 VE |
| 2006/0103289 A1* | 5/2006 | Kim | ............ | B05B 12/20 313/402 |
| 2009/0286447 A1* | 11/2009 | Kobayashi | ............ | H01L 51/56 445/58 |
| 2010/0112194 A1* | 5/2010 | Inoue | ............ | C23C 14/042 427/66 |
| 2011/0171768 A1* | 7/2011 | Hong | ............ | C23C 14/042 438/34 |
| 2012/0107506 A1* | 5/2012 | Ukigaya | ............ | C23C 14/042 427/272 |
| 2012/0240850 A1* | 9/2012 | Kobayashi | ............ | C23C 14/042 118/504 |
| 2012/0282445 A1* | 11/2012 | Kim | ............ | C23C 14/042 428/209 |

(Continued)

FOREIGN PATENT DOCUMENTS

JP   2007193132 A   8/2007
JP   2018145451 A   9/2018

(Continued)

*Primary Examiner* — Jethro M. Pence
(74) *Attorney, Agent, or Firm* — Suiter Swantz pc llo

(57) ABSTRACT

A system and method includes pre-warping a mask to induce strain when affixed to a substrate and ensure positive contact between the mask and the substrate during all phases of deposition. A film is applied to the mask at a rate sufficient to impart stress to the film faster than such stress can be released. Depending on the features defined by the mask, the pre-warping may be concentric, linear along one axis, or complex along a plurality of axes.

15 Claims, 7 Drawing Sheets

(56) References Cited

U.S. PATENT DOCUMENTS

| | | | | |
|---|---|---|---|---|
| 2016/0186305 A1* | 6/2016 | Han | ............... | H01L 51/0011 |
| | | | | 118/623 |
| 2016/0186317 A1* | 6/2016 | Han | ............... | C23C 14/042 |
| | | | | 29/464 |
| 2017/0362698 A1* | 12/2017 | Kobayashi | ............... | C23C 16/44 |
| 2018/0071764 A1* | 3/2018 | Gong | ............... | C23C 14/042 |
| 2018/0209029 A1* | 7/2018 | Lin | ............... | C23C 14/24 |
| 2018/0248120 A1* | 8/2018 | Zhang | ............... | C23C 14/04 |
| 2019/0203337 A1* | 7/2019 | Luo | ............... | C23C 14/54 |
| 2019/0242012 A1* | 8/2019 | Wang | ............... | B05C 21/005 |
| 2019/0323117 A1* | 10/2019 | Ikenaga | ............... | C23F 1/02 |

FOREIGN PATENT DOCUMENTS

| | | |
|---|---|---|
| KR | 101493119 B1 | 2/2015 |
| TW | I354358 B | 12/2011 |
| WO | 2017163440 A1 | 9/2017 |

* cited by examiner

CONTROLLED WARPING OF SHADOW MASK TOOLING FOR IMPROVED RELIABILITY AND MINITURIZATION VIA THIN FILM DEPOSITION

BACKGROUND

Thin film deposition processes, including physical vapor deposition, sputtering, and pulsed laser deposition, etc., are used in microelectronic packaging to deposit thin layers of material with high accuracy. Shadow masks are used to selectively deposit material onto specific locations of the substrate with complex geometries. The quality and resolution of the deposition is directly dependent on contact uniformity to the substrate; low contact uniformity yields low deposition quality and resolution.

Alignment pins and fixture hardware are currently used to control shadow mask placement and hold the shadow mask flush with the substrate. However, inherent warping and design tolerances in the shadow mask can cause regions to be elevated from the substrate surface even when fixture hardware is used.

SUMMARY

In one aspect, embodiments of the inventive concepts disclosed herein are directed to a system and method for pre-warping a mask to induce strain that produces a corresponding stress when affixed to a substrate and ensure positive contact between the mask and the substrate during all phases of deposition. A film is applied to the mask at a rate sufficient to impart stress to the film faster than such stress can be released.

In a further aspect, depending on the features defined by the mask, the pre-warping may be concentric, linear along one axis, or complex along a plurality of axes.

It is to be understood that both the foregoing general description and the following detailed description are exemplary and explanatory only and should not restrict the scope of the claims. The accompanying drawings, which are incorporated in and constitute a part of the specification, illustrate exemplary embodiments of the inventive concepts disclosed herein and together with the general description, serve to explain the principles.

BRIEF DESCRIPTION OF THE DRAWINGS

The numerous advantages of the embodiments of the inventive concepts disclosed herein may be better understood by those skilled in the art by reference to the accompanying figures in which.

DETAILED DESCRIPTION

Figure 1A:
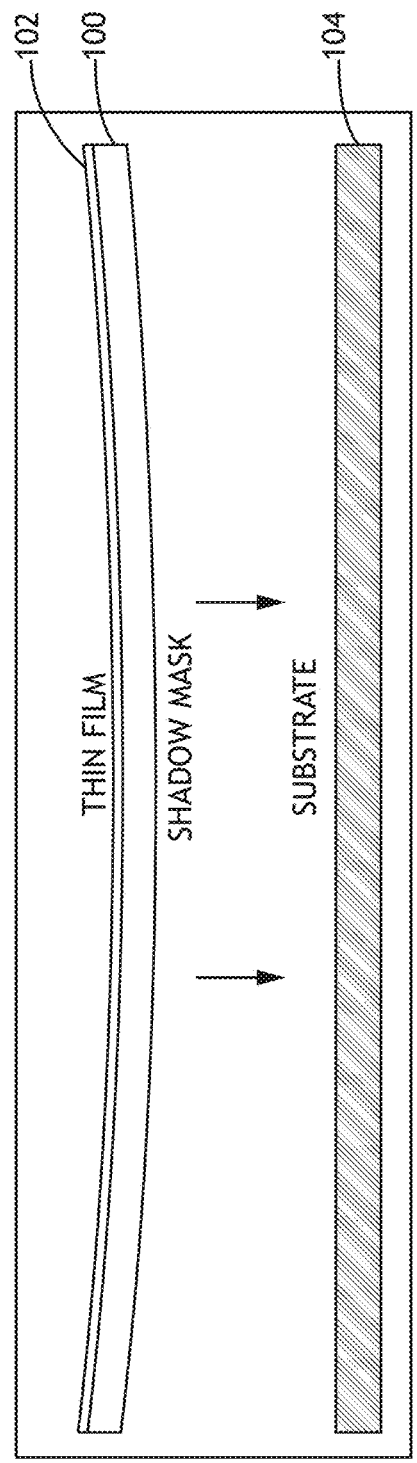
FIG. 1A shows a side, environmental view of a warped mask according to an exemplary embodiment.

Before explaining at least one embodiment of the inventive concepts disclosed herein in detail, it is to be understood that the inventive concepts are not limited in their application to the details of construction and the arrangement of the components or steps or methodologies set forth in the following description or illustrated in the drawings. In the following detailed description of embodiments of the instant inventive concepts, numerous specific details are set forth in order to provide a more thorough understanding of the inventive concepts. However, it will be apparent to one of ordinary skill in the art having the benefit of the instant disclosure that the inventive concepts disclosed herein may be practiced without these specific details. In other instances, well-known features may not be described in detail to avoid unnecessarily complicating the instant disclosure. The inventive concepts disclosed herein are capable of other embodiments or of being practiced or carried out in various ways. Also, it is to be understood that the phraseology and terminology employed herein is for the purpose of description and should not be regarded as limiting.

As used herein a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only, and should not be construed to limit the inventive concepts disclosed herein in any way unless expressly stated to the contrary.

Further, unless expressly stated to the contrary, "or" refers to an inclusive or and not to an exclusive or. For example, a condition A or B is satisfied by anyone of the following: A is true (or present) and B is false (or not present), A is false (or not present) and B is true (or present), and both A and B are true (or present).

In addition, use of the "a" or "an" are employed to describe elements and components of embodiments of the instant inventive concepts. This is done merely for convenience and to give a general sense of the inventive concepts, and "a" and "an" are intended to include one or at least one and the singular also includes the plural unless it is obvious that it is meant otherwise.

Finally, as used herein any reference to "one embodiment," or "some embodiments" means that a particular element, feature, structure, or characteristic described in connection with the embodiment is included in at least one embodiment of the inventive concepts disclosed herein. The appearances of the phrase "in some embodiments" in various places in the specification are not necessarily all referring to the same embodiment, and embodiments of the inventive concepts disclosed may include one or more of the features expressly described or inherently present herein, or any combination of sub-combination of two or more such features, along with any other features which may not necessarily be expressly described or inherently present in the instant disclosure.

Broadly, embodiments of the inventive concepts disclosed herein are directed to a system and method for pre-warping a mask to induce strain that produces a corresponding stress when affixed to a substrate and ensure positive contact between the mask and the substrate during all phases of deposition. A film is applied to the mask at a rate sufficient to impart stress to the film faster than such stress can be released.

Figure 1B:
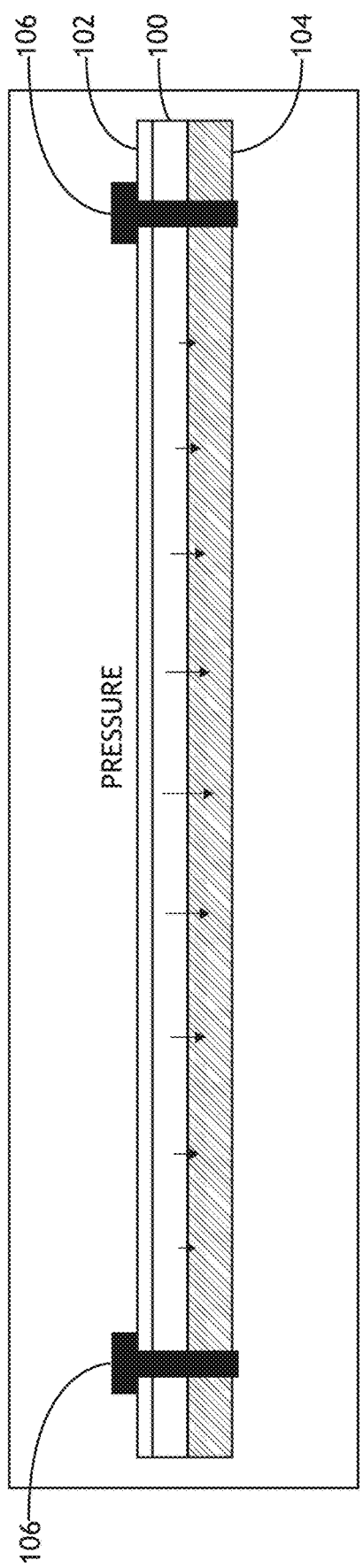
FIG. 1B shows a side, environmental view of a warped mask according to an exemplary embodiment.

Referring to FIGS. 1A-1B, side, environmental views of a warped mask 100 according to an exemplary embodiment are shown. During a film deposition process, a mask 100 is pre-warped via a thin film deposition 102 to the mask 100. The combined mask 100 and thin film 102 is then applied to a substrate 104. Because of the pre-warping, the mask 100 maintains positive contact with the substrate 104. Where the combined mask 100 and thin film 102 is affixed to the substrate 104 via fixation hardware 106 such as pins, screws, clamps, etc., the strain caused by the pre-warping is reflected as stress on the mask 100 and a corresponding pressure between the mask 100 and the substrate 104. During later deposition processes to the substrate 104, the stress is sufficiently maintained to ensure the pressure is never released. Such pressure may conform to a spring-like coefficient. The composition of the thin film deposition 102 may be application dependent based on the features of the mask 100 and desired warping; for example, the thin film deposition 102 may include, but is not limited to, a metal or ceramic film.

Figure 2A:
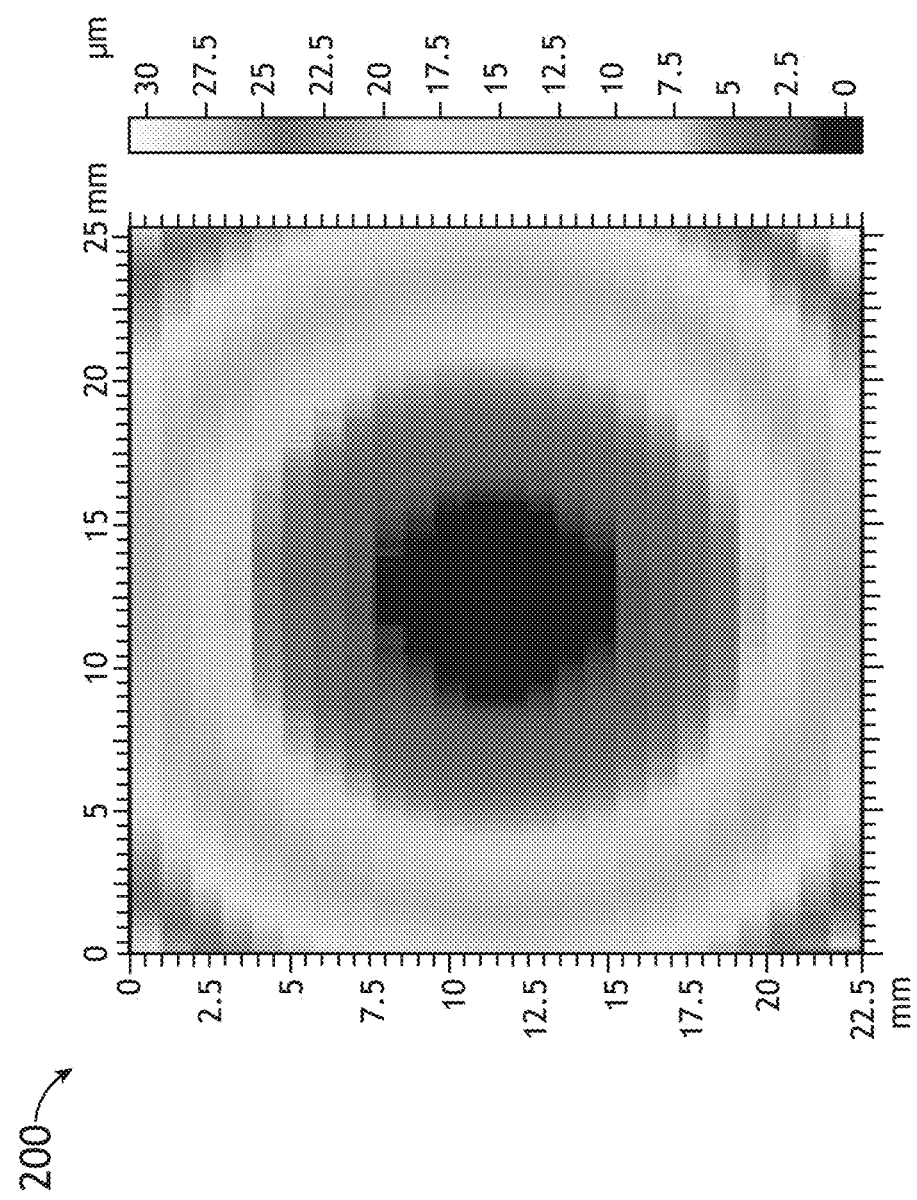
FIG. 2A shows a top, graphical representation of strain on a warped mask according to an exemplary embodiment.
Figure 2B:
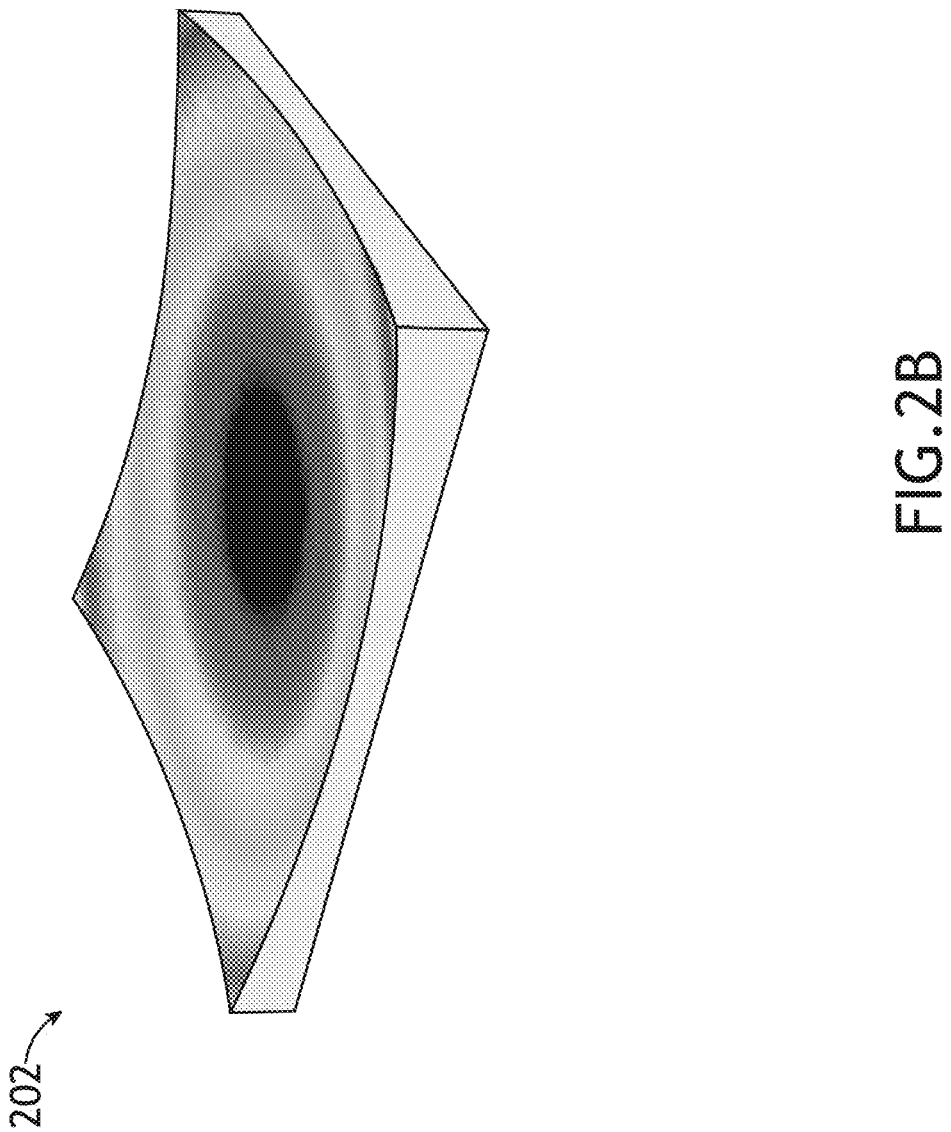
FIG. 2B shows a perspective, graphical representation of strain on a warped mask according to an exemplary embodiment.

Referring to FIGS. 2A-2B, top and side graphical representations of strain 200, 202 on a warped mask according to an exemplary embodiment are shown. The stress imparted to a mask via a thin film deposition is reflected as strain 200, 202 in the mask that may produce deflection in portions of the mask. In at least one embodiment, such strain 200, 202 may be concentric (generally uniform deflection from a central portion of the mask), linear (deflection along a single axis), or complex (deflection on two or more axes). Depending on the elements defined by the mask, wavelike deflections may be desirable, or any other geometry to maintain positive contact where there are openings for film deposition.

Figure 3:
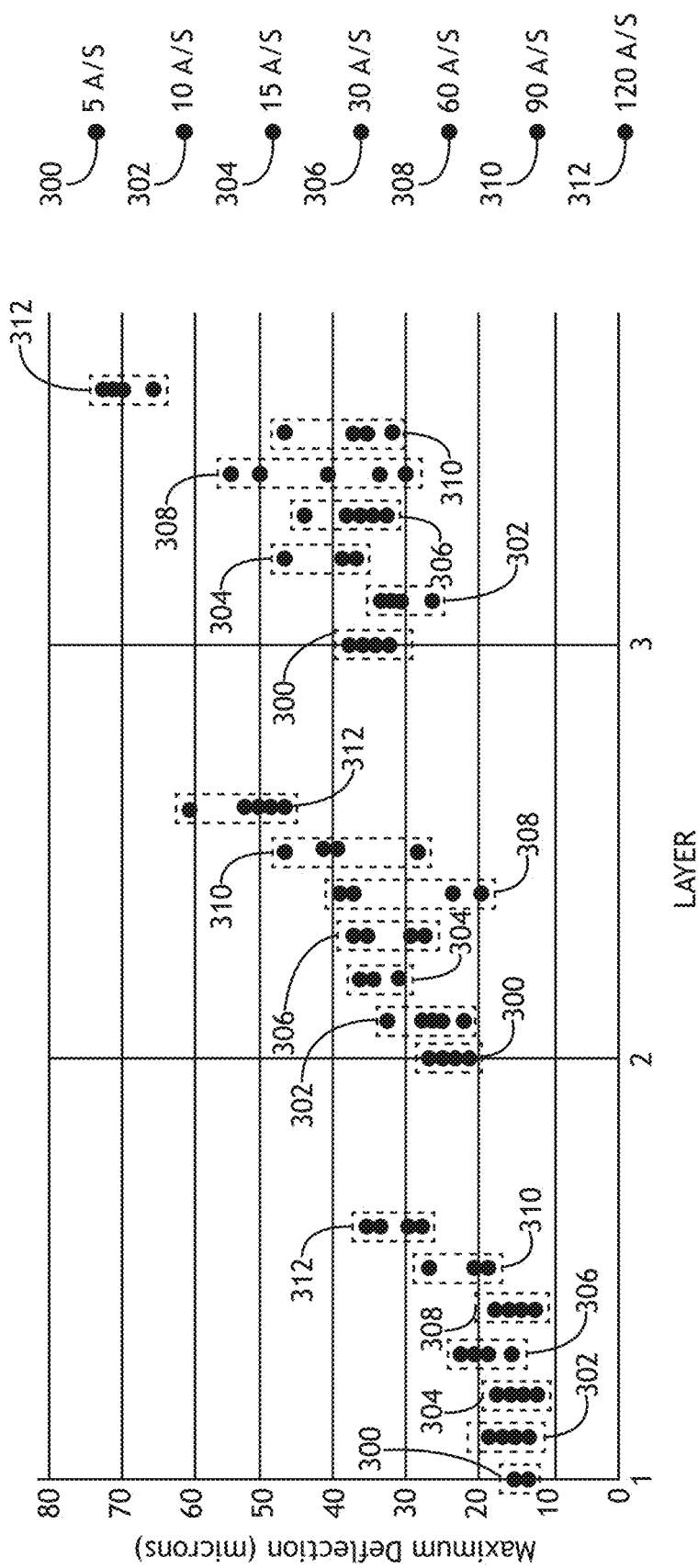
FIG. 3 shows a graph of mask film deflection with respect to deposition rate.

Referring to FIG. 3, a graph of mask film deflection with respect to deposition rate is shown. Deflection (pre-warping) of the mask is primarily dependent on deposition rate 300, 302, 304, 306, 308, 310, 312. For example, for any number of layers, a five angstroms per second deposition rate 300 or ten angstroms per second deposition rate 302, which may be an otherwise normal deposition rate during thin film deposition processes, produces substantially less deflection as compared to a ninety angstroms per second deposition rate 310 or one hundred twenty angstroms per second deposition rate 312. Higher deposition rates 300, 302, 304, 306, 308, 310, 312 may not allow the deposited material to relax into its most thermodynamically stable state structure.

It may be appreciated that a higher deposition rate is useful for imparting mask deflection. Furthermore, deflection due to higher deposition rate, and the corresponding stress and pressure and the mask/substrate interface, will be maintained during later, lower deposition rate processes.

Figure 4:
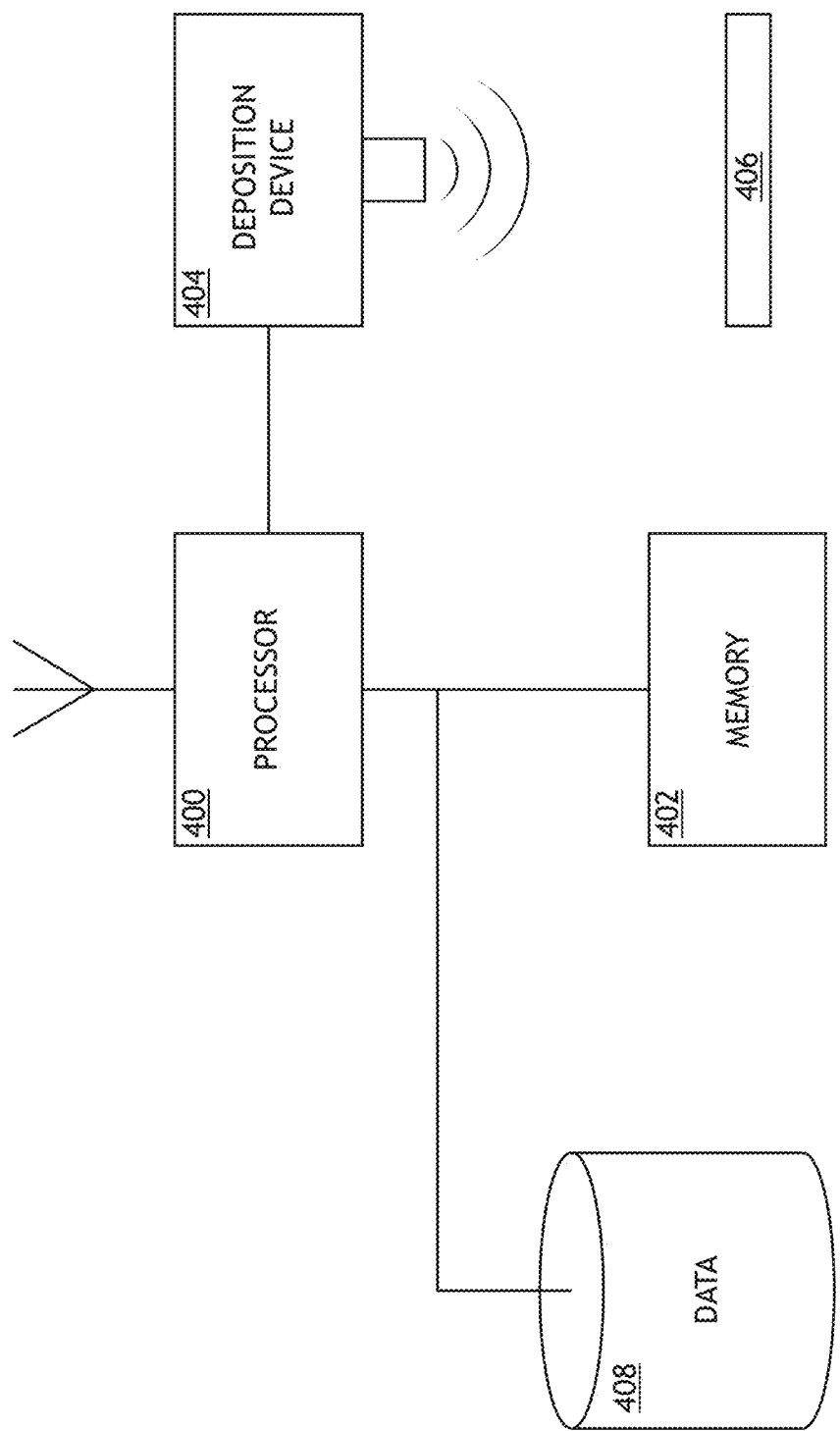
FIG. 4 shows a block diagram of a system according to an exemplary embodiment.

Referring to FIG. 4, a block diagram of a system according to an exemplary embodiment is shown. The system includes a processor 400, memory 402 connected to the processor 400 for embodying processor executable code, and a film deposition device 404 connected to the processor 400. The film deposition device 404 is configured to apply a thin film to a mask 406 at a deposition rate sufficient to induce warping in the mask 406.

In at least one embodiment, the processor 400 may be configured to apply a fairly uniform thin film via the film deposition device 404 for a substantially concentric warping. In at least one embodiment, a separate, warping mask may be used to control deposition on the mask 406 for linear or otherwise complex warping.

In at least one embodiment, a separate data storage device 406 may store deposition profiles including deposition rates, numbers of deposition layers, or other parameters that may be adjusted to alter warping to the mask 406.

In at least one embodiment, where a substrate is curved, it may be desirable for the mask 406 to include a conforming curvature. In such embodiments, the pre-warping of the mask 406 may be configured to produce that conforming curvature. For example, if may be desirable to apply electronic components to a curved substrate to form radiating elements in an antenna.

In at least one embodiment, it may be desirable to apply a grid pattern or a sequence of squares in a grid or hexagonal pattern. Such embodiments may induce specific topology in the mask 406.

Figure 5:
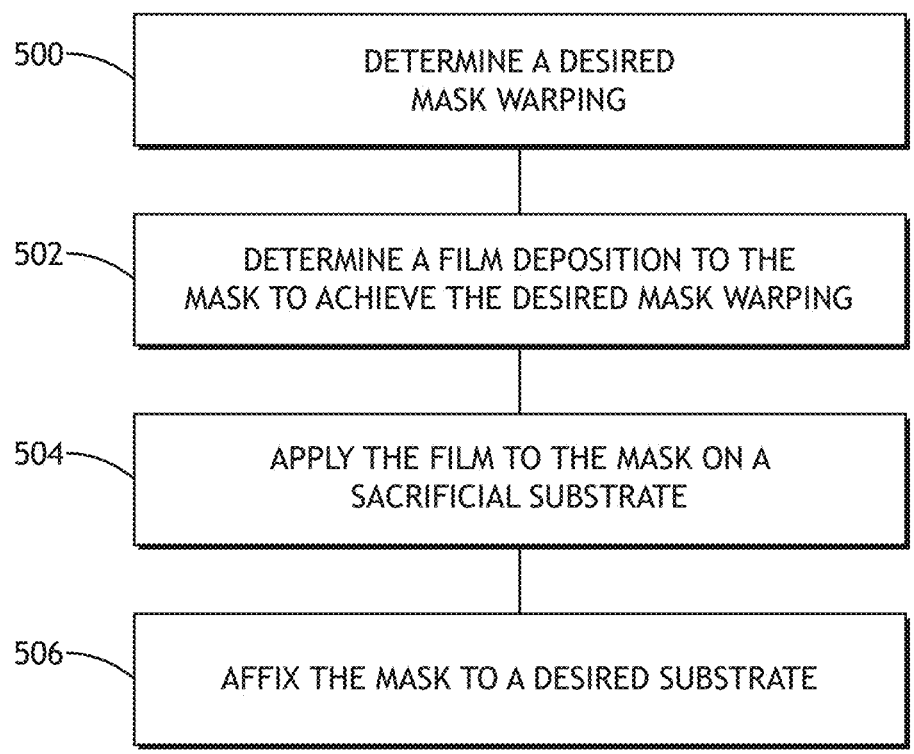
FIG. 5 shows a flowchart of a method for warping a mask according to an exemplary embodiment.

Referring to FIG. 5, a flowchart of a method for warping a mask according to an exemplary embodiment is shown. A processor determines 500 a desired mask warping profile including a warping shape and warping degree. The processor determines 502 film deposition parameters to a mask to produce the desired mask warping. Such parameters may include deposition rate where higher deposition rates tend to produce increased warping, deposition thickness, number of deposited layers, etc. Deposition rates may vary from five angstroms per second to more than one hundred twenty angstroms per second. Layer thickness may be on the order of five hundred or one thousand nanometers.

The determined film is then applied 504 to the mask and the mask is affixed 506 to a desired substrate. The warped mask includes strain that creates pressure at the interface between the mask and the substrate when affixed 506.

It is believed that the inventive concepts disclosed herein and many of their attendant advantages will be understood by the foregoing description of embodiments of the inventive concepts disclosed, and it will be apparent that various changes may be made in the form, construction, and arrangement of the components thereof without departing from the broad scope of the inventive concepts disclosed herein or without sacrificing all of their material advantages; and individual features from various embodiments may be combined to arrive at other embodiments. The form herein before described being merely an explanatory embodiment thereof, it is the intention of the following claims to encompass and include such changes. Furthermore, any of the features disclosed in relation to any of the individual embodiments may be incorporated into any other embodiment.

What is claimed is:

1. A method for ensuring positive contact between a mask and a desired substrate during a film deposition process, the method comprising:
    determining a desired warping for a film deposition mask;
    applying a thin film to the film deposition mask to induce the desired warping;
    positioning the film deposition mask on a substrate; and
    affixing the film deposition mask to the substrate,
    wherein the desired warping is configured to impart a strain to the film deposition mask such that the film deposition mask is in positive contact with at least one or more portions of the substrate when affixed to the substrate, and during every phase of film deposition to the substrate.

2. The method of claim 1, wherein applying the thin film comprises depositing a film at a deposition rate greater than a predefined threshold.

3. The method of claim 2, wherein the predefined threshold is at least fifty angstroms per second.

4. The method of claim 3, wherein applying the thin film comprises applying a plurality of thin film layers, each no more than one thousand nanometers thick.

5. The method of claim 1, wherein the desired warping comprises concentric warping of the film deposition mask.

6. The method of claim 1, wherein the desired warping comprises linear warping along an axis.

7. The method of claim 1, wherein the desired warping comprises complex warping along a plurality of axes.

8. A system for thin film deposition comprising:

a material deposition element; and at least one processor in data communication with the material deposition element and a memory storing processor executable code for configuring the at least one processor to:

determine a desired warping for a film deposition mask; and apply a thin film to the film deposition mask, via the material deposition element, to induce the desired warping, wherein the desired warping is configured to impart a strain to the film deposition mask such that the film deposition mask is in positive contact with at least one or more portions of a substrate when affixed to the substrate, and during every phase of film deposition to the substrate.

9. The system of claim 8, wherein applying the thin film comprises depositing a film at a deposition rate greater than a predefined threshold.

10. The system of claim 9, wherein the predefined threshold is at least fifty angstroms per second.

11. The system of claim 10, wherein applying the thin film comprises applying a plurality of thin film layers, each no more than one thousand nanometers thick.

12. The system of claim 8, wherein the desired warping comprises concentric warping of the film deposition mask.

13. The system of claim 8, wherein the desired warping comprises linear warping along an axis.

14. The system of claim 8, wherein the desired warping comprises complex warping along a plurality of axes.

15. The system of claim 8, wherein determining the desired warping comprising mapping a curved substrate and determining a warping of the film deposition mask to conform to the curved substrate.

* * * * *